(12) United States Patent
Lefebvre et al.

(10) Patent No.: US 11,454,490 B2
(45) Date of Patent: Sep. 27, 2022

(54) STRAIN SENSOR PLACEMENT

(71) Applicant: General Electric Company, Schenectady, NY (US)

(72) Inventors: Louis Lefebvre, Valcourt (CA); Chinedu Francis Dibia, Waterloo (CA)

(73) Assignee: General Electric Company, Schenectady, NY (US)

( * ) Notice: Subject to any disclaimer, the term of this patent is extended or adjusted under 35 U.S.C. 154(b) by 799 days.

(21) Appl. No.: 16/372,137

(22) Filed: Apr. 1, 2019

(65) Prior Publication Data
US 2020/0309507 A1  Oct. 1, 2020

(51) Int. Cl.
| | | |
|---|---|---|
| *B33Y 50/02* | (2015.01) |
| *B29C 64/393* | (2017.01) |
| *G01B 7/16* | (2006.01) |
| *B33Y 10/00* | (2015.01) |
| *B33Y 30/00* | (2015.01) |
| *B33Y 70/00* | (2020.01) |
| *B29C 64/20* | (2017.01) |
| *B33Y 80/00* | (2015.01) |
| *B29C 64/112* | (2017.01) |
| *G06F 30/20* | (2020.01) |
| *B29L 31/00* | (2006.01) |
| *B29K 505/00* | (2006.01) |

(52) U.S. Cl.
CPC .............. *G01B 7/20* (2013.01); *B29C 64/112* (2017.08); *B29C 64/20* (2017.08); *B29C 64/393* (2017.08); *B33Y 10/00* (2014.12); *B33Y 30/00* (2014.12); *B33Y 50/02* (2014.12); *B33Y 70/00* (2014.12); *B33Y 80/00* (2014.12);
*G06F 30/20* (2020.01); *B29K 2505/00* (2013.01); *B29L 2031/752* (2013.01)

(58) Field of Classification Search
CPC ..... B29C 64/112; B29C 64/20; B29C 64/393; B29C 70/74; B29K 2505/00; B29L 2031/752; B33Y 10/00; B33Y 30/00; B33Y 50/02; B33Y 70/00; B33Y 70/10; B33Y 80/00; G01B 7/20; G06F 30/20
See application file for complete search history.

(56) References Cited

U.S. PATENT DOCUMENTS

| | | | |
|---|---|---|---|
| 5,492,002 A | * | 2/1996 | Higgins ................ G01M 17/10 73/1.14 |
| 5,729,108 A | * | 3/1998 | Steele .................... F16M 11/18 180/19.1 |
| 6,251,488 B1 | | 6/2001 | Miller et al. |
| 7,658,163 B2 | | 2/2010 | Renn et al. |
| 7,987,813 B2 | | 8/2011 | Renn et al. |
| 8,132,744 B2 | | 3/2012 | King et al. |

(Continued)

OTHER PUBLICATIONS

Jeremy Vandenberg "Additive Manufacturing of High Temperature Strain Gauges" (Year: 2018).*

*Primary Examiner* — Yuhui R Pan
(74) *Attorney, Agent, or Firm* — Hanley, Flight & Zimmerman, LLC

(57) ABSTRACT

A method for measuring strain of a component includes determining a preferred placement for a strain sensor on the component, and a preferred feature dimension and orientation for the strain sensor at the preferred placement on the component; and printing the strain sensor at the preferred placement on the component with the preferred feature dimension and orientation.

13 Claims, 6 Drawing Sheets

(56) References Cited

U.S. PATENT DOCUMENTS

| | | |
|---|---|---|
| 8,272,579 B2 | 9/2012 | King et al. |
| 8,796,146 B2 | 8/2014 | Renn et al. |
| 8,887,658 B2 | 11/2014 | Essien et al. |
| 9,192,054 B2 | 11/2015 | King et al. |
| 2005/0156991 A1 | 7/2005 | Renn |
| 2006/0280866 A1 | 12/2006 | Marquez et al. |
| 2018/0067003 A1* | 3/2018 | Michiwaki ............... G01L 1/22 |
| 2020/0094633 A1* | 3/2020 | Decoster ............... B33Y 80/00 |

* cited by examiner

STRAIN SENSOR PLACEMENT

FIELD

The present disclosure generally relates to a system and method for providing strain sensors on a component.

BACKGROUND

Determining a strain on a particular aspect of a component may allow, e.g., for an installer of the component to confirm the component is installed correctly within the machine incorporating the component, or for the manufacture to confirm that the component was designed appropriately to withstand operational forces. For example, greater than anticipated strain on the component may signal to the installer or manufacturer that the component is not properly installed or that the component may wear out prematurely under normal operating conditions.

However, certain components may have nonlinear and nonplanar geometries and loads that result in a nonuniform strain fields having relatively focused strain gradients. Conventional strain sensors having a predetermined shape and size may not be capable of determining the strain over such relatively focused strain gradients, as conventional strain sensors return an average strain across the entirety of its size/sensing area. Further, the nonlinear and nonplanar geometries may result in a relatively low, or varying, strain transfer ratio from the component to the strain sensor. Each of these issues may result in an inaccurate strain reading for the component.

Accordingly, a system and method for more accurately determining a strain on a component, and particularly over a nonlinear and nonplanar geometry of the component, would be useful.

BRIEF DESCRIPTION

Aspects and advantages will be set forth in part in the following description, or may be obvious from the description, or may be learned through practice of the invention.

In an exemplary aspect of the present disclosure, a method for measuring strain of a component is provided. The method includes determining a preferred placement for a strain sensor on the component, and a preferred feature dimension and orientation for the strain sensor at the preferred placement on the component; and printing the strain sensor at the preferred placement on the component with the preferred feature dimension and orientation.

In certain exemplary aspects determining the preferred placement for the strain sensor on the component, and the preferred feature dimension and orientation for the strain sensor at the preferred placement on the component includes modeling the component.

For example, in certain exemplary aspects modeling the component includes performing an iterative computer analysis of strain on the component to determine the preferred placement for the strain sensor on the component, and preferred feature dimension and orientation for the strain sensor at the preferred placement on the component.

For example, in certain exemplary aspects performing the iterative computer analysis of the component includes modeling a plurality of scenarios varying a simulated placement of the strain sensor, a simulated size of the strain sensor, a simulated orientation of the strain sensor, or a combination these parameters to determine the preferred placement for the strain sensor, the preferred feature dimension for the strain sensor, the preferred orientation for the strain sensor, or a combination these parameters.

For example, in certain exemplary aspects performing the iterative computer analysis of the component includes modeling a plurality of scenarios varying a simulated placement of the strain sensor, a simulated size of the strain sensor, and a simulated orientation of the strain sensor to determine the preferred placement for the strain sensor, the preferred feature dimension for the strain sensor, and the preferred orientation for the strain sensor.

For example, in certain exemplary aspects modeling the component includes performing the iterative computer analysis of strain on the component to determine the preferred placement for the strain sensor on the component, and the preferred feature dimension and orientation for the strain sensor at the preferred placement on the component to provide a desired strain transfer from the component to the strain sensor.

In certain exemplary aspects determining the preferred placement for the strain sensor on the component, and the preferred feature dimension and orientation for the strain sensor at the preferred placement on the component includes determining an area on the component having a substantially uniform strain.

For example, in certain exemplary aspects printing the strain sensor at the preferred placement on the component with the preferred feature dimension and orientation includes printing the strain sensor within the area on the component having the substantially uniform strain.

In certain exemplary aspects determining the preferred placement for the strain sensor on the component, and the preferred feature dimension and orientation for the strain sensor at the preferred placement on the component includes: determining a surface feature indicating a high strain; determining a strain gradient within an area over the surface feature; and correlating the preferred feature dimension for the strain sensor to the determined strain gradient.

For example, in certain exemplary aspects determining the preferred placement for the strain sensor on the component, and the preferred feature dimension and orientation for the strain sensor at the preferred placement on the component further includes: determining a strain orientation within the area over the surface feature; and correlating the preferred orientation for the strain sensor to the determined strain orientation.

In certain exemplary aspects determining the preferred placement for the strain sensor on the component, and the preferred feature dimension and orientation for the strain sensor at the preferred placement on the component further includes determining a preferred shape for the strain sensor, and wherein printing the strain sensor at the preferred placement on the component with the preferred feature dimension and orientation further includes printing the strain sensor in the preferred shape.

For example, in certain exemplary aspects printing the strain sensor in the preferred shape includes printing the strain sensor with a nonlinear mean line.

In certain exemplary aspects determining the preferred placement for the strain sensor on the component, and the preferred feature dimension and orientation for the strain sensor at the preferred placement on the component includes determining a preferred placement for a plurality of strain sensors on the component, and a preferred feature dimension and orientation for the plurality of strain sensors at the respective preferred placements on the component, and wherein printing the strain sensor at the preferred placement on the component with the preferred feature dimension and orientation includes printing the plurality of strain sensors at their respective preferred placements on the component in their respective preferred feature dimensions and in their respective preferred orientations.

For example, in certain exemplary aspects each of the preferred feature dimensions of the respective plurality of strain sensors is unique.

In certain exemplary aspects the component is a component of a gas turbine engine having a non-planar surface.

In certain exemplary aspects printing the strain sensor at the preferred feature dimension and in the preferred orientation at the preferred placement on the component includes printing the strain sensor on the component using an aerosol-based direct-write process utilizing an aerosol ink including chromium containing alloy particles.

In an exemplary embodiment of the present disclosure, a system for measuring strain of a component is provided. The system includes a printer including an atomizer and a print heat fluidly connected to the atomizer for receiving an aerosol ink from the atomizer; and a control system operable with the printer, the control system including one or more processors and memory, the memory storing instructions that, when executed by the one or more processors, cause the system to: determine a preferred placement for a strain sensor on the component, and a preferred feature dimension and orientation for the strain sensor at the preferred placement on the component; and print the strain sensor at the preferred placement on the component with the preferred feature dimension and in the preferred orientation.

In certain exemplary embodiments the aerosol ink includes chromium containing alloy particles.

In certain exemplary embodiments in determining the preferred placement for the strain sensor on the component, and the preferred feature dimension and orientation for the strain sensor at the preferred placement on the component the system is configured to model the component.

For example, in certain exemplary embodiments in modeling the component the system is configured to perform an iterative computer analysis of strain on the component to determine the preferred placement for the strain sensor on the component, and the preferred feature dimension and orientation for the strain sensor at the preferred placement on the component.

These and other features, aspects and advantages will become better understood with reference to the following description and appended claims. The accompanying drawings, which are incorporated in and constitute a part of this specification, illustrate embodiments of the invention and, together with the description, serve to explain certain principles of the invention.

BRIEF DESCRIPTION OF THE DRAWINGS

A full and enabling disclosure of the present invention, including the best mode thereof, directed to one of ordinary skill in the art, is set forth in the specification, which makes reference to the appended FIGS., in which.

Figure 1:
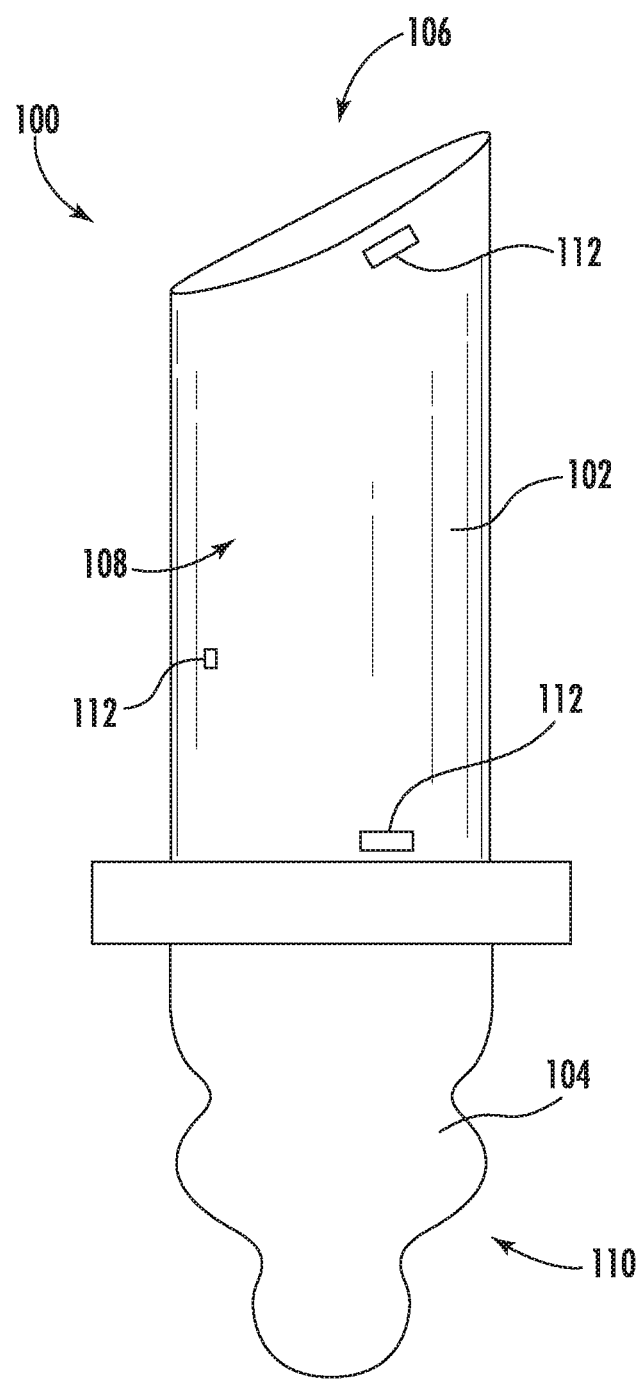
FIG. 1 shows a component in accordance with an exemplary embodiment of the present disclosure.

Repeat use of reference characters in the present specification and drawings is intended to represent the same or analogous features or elements of the present invention.

DETAILED DESCRIPTION

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents.

As used herein, the terms "first", "second", and "third" may be used interchangeably to distinguish one feature from another and are not intended to signify importance of the individual components.

A system and method for measuring strain on a component is generally provided. The system and method may determine a preferred placement for a strain sensor, as well as a preferred feature dimension and orientation for the strain sensor at the preferred placement on the component. The system and method may then print the strain sensor at the preferred placement on the component and with the preferred feature dimension and orientation. For example, the system and method may print the strain sensor in such a manner utilizing an aerosol based direct-right process utilizing an aerosol ink, such as an aerosol ink having chromium containing alloy particles.

In certain exemplary aspects, the system and method may utilize modeling to determine the preferred placement for the strain sensor from as well as the preferred feature dimension and orientation for the strain sensor at the preferred placement. The modeling may utilize an iterative computer analysis of the strain of the component, varying placement, size, and orientation of simulated strain sensors over a plurality of simulations to determine the preferred placement, size, and orientation of the strain sensor for printing. For example, the modeling may vary the simulated placement, size, and orientation over hundreds or thousands of simulations to determine the preferred placement, size, and orientation. Notably, such modeling may also be used to determine the preferred placement, size, and orientation to provide a desired strain transfer from the component to the strain sensor, and further may be utilized to determine the preferred shape for the strain sensor.

Referring now to the Figures, FIG. 1 depicts a component in accordance with an exemplary aspect of the present disclosure on which one or more strain sensors may be printed. For the embodiment shown, the component is a rotor blade 100, such as a compressor rotor blade or a turbine rotor blade, as may be incorporated into a gas turbine engine. The rotor blade 100 includes an airfoil 102 and a base 104. The airfoil 102 defines a pressure side 106 and a suction side 108. Each of the pressure side 106 and suction side 108 are, for the embodiment depicted, non-linear and non-planar geometries. Similarly, the base 104 of the rotor blade 100 includes non-linear and non-planar geometries as well. For example, the base 104 includes a dovetail section 110, which as will be appreciated may assist with the installation of the rotor blade 100. Further, for exemplary purposes, the rotor blade 100 depicts a plurality of strain sensors 112 positioned thereon, and more specifically, printed thereon. The strain sensors 112 each have unique sizes, shapes, orientations, and placements.

As will be discussed below, the systems and methods of the present disclosure may facilitate measuring strain on the rotor blade 100 with relative accuracy despite the non-linear and non-planar geometries, which may further result in non-uniform strain fields thereacross.

Figure 2:
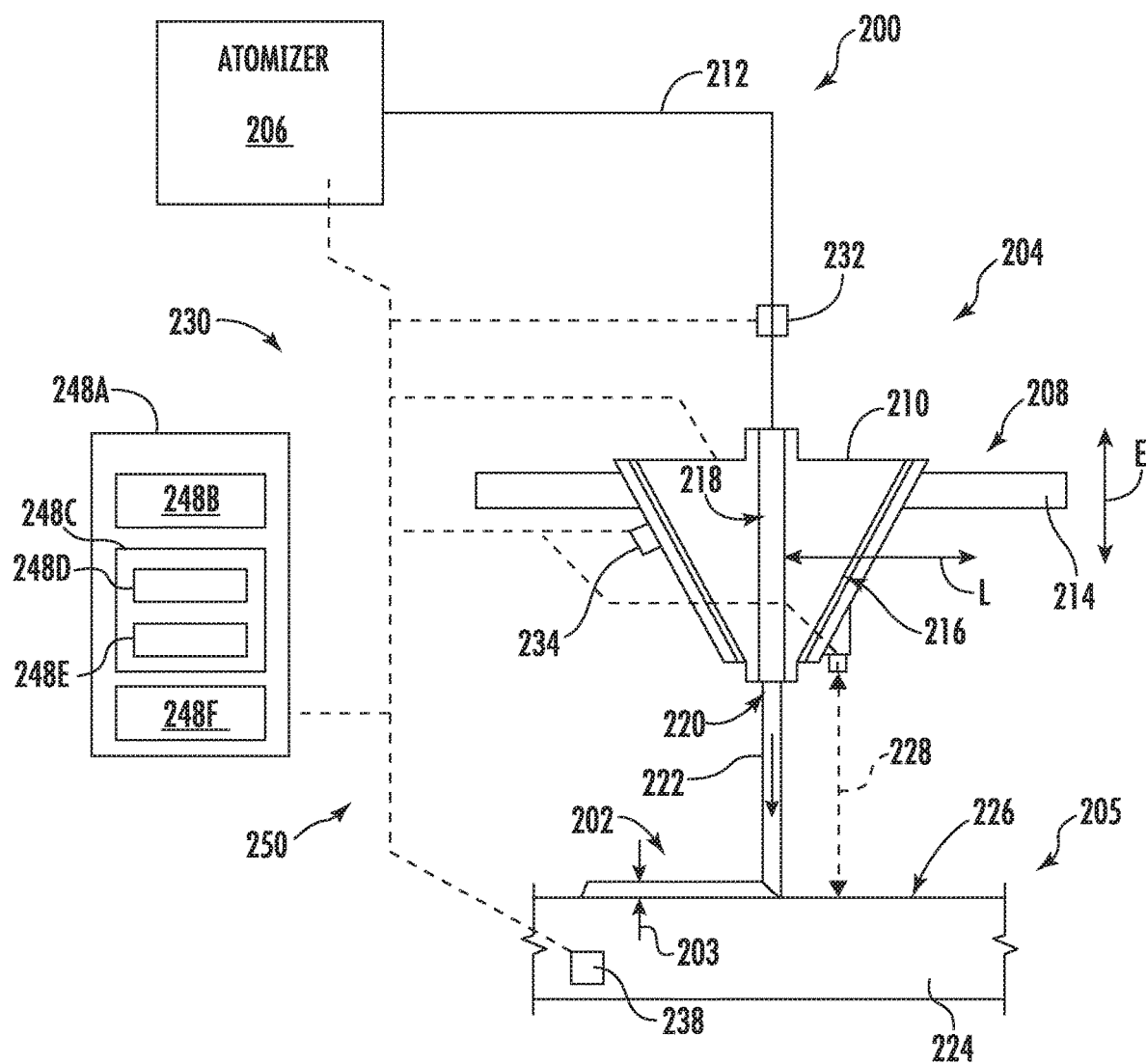
FIG. 2 shows system for printing a strain sensor on a component in accordance with an exemplary embodiment of the present disclosure.

Referring now to FIG. 2, a system 200 for printing a strain sensor 202 on a component 205 using an aerosol ink is provided. For example, the system 200 may be utilized to print the one or more strain sensors 112 on the rotor blade 100 described above with reference to FIG. 1 (which may be similar to the strain sensors 202 discussed herein below). Alternatively, the system 200 may be utilized to print one or more strain sensors 202 on any other suitable component 205. Further, will be appreciated, that as used herein, the term "component 205" is used generically to refer to any part, subpart, etc. of a machine, as well as to any standalone part, substrate, platform, etc.

The exemplary system 200 of FIG. 2 generally includes a printer 204 having an atomizer 206 and a printhead assembly 208. The printhead assembly 208 includes a printhead 210 fluidly connected to the atomizer 206 for receiving an aerosol ink from the atomizer 206. The atomizer 206 may be any suitable component 205 capable of generating a relatively dense mist of material-laden droplets, i.e., the aerosol ink. The material-laden droplets/aerosol ink generated by the atomizer 206 and provided through the printhead assembly 208 (discussed in more detail below) may be nanoparticles. The term "nanoparticles" refers to particles having a maximum dimension of 100 nonometers ("nm"). In particular embodiments, the nanoparticles may have a maximum dimension of 25 nm to 100 nm (e.g., 50 nm to 100 nm).

For the embodiment depicted, the atomizer 206 is fluidly connected to the printhead 210 through a supply line 212. As such, the atomizer 206 and printhead 210 are separate components 205 for the embodiment shown. However, in other embodiments, the atomizer 206 may be incorporated into, or otherwise formed integrally with, the printhead 210.

Referring still to FIG. 2, the printhead assembly 208 includes a track 214, with the printhead 210 movably coupled to the track 214. Although not depicted, the printhead assembly 208 may include one or more motors for moving the printhead 210 in a lateral direction L along the track 214. It will further be appreciated that for the embodiment shown, the movable connection between the printhead 210 the track 214 further allows for the printhead 210 to move in a transverse direction (not shown in FIG. 2; a direction perpendicular to the plane depicted in FIG. 2) and an extension direction E, perpendicular to both the transverse direction and the lateral direction L. In such a manner, the system 200 may be capable of moving the printhead 210 along substantially any three-dimensional path. Alternatively, in other embodiments, any other suitable assembly may be provided for moving the printhead 210 relative to the component 205 (or the component 205 relative to the printhead 210).

Moreover, the exemplary printhead 210 depicted further defines one or more sheath gas paths 216, an aerosol ink path 218, and an aerosol ink outlet 220. The printhead 210 may receive pressurized sheath gas through the one or more sheath gas paths 216 from a sheath gas source (not depicted). Further, the printhead 210 may provide aerosol ink received through the supply line 212 through the aerosol ink path 218 to the aerosol ink outlet 220. The printhead 210 may further be configured to surround an aerosol ink deposition path 222 provided through the aerosol ink outlet 220 of the printhead 210 with a substantially annular sheath gas ring during operation. Such may allow the aerosol ink deposition path 222 to be relatively concentrated for printing the one or more strain sensors on the component 205, as will be described in more detail below.

The system 200 is further operable with a platform (not shown) to which the component 205 is mounted. The exemplary component 205 depicted in FIG. 2 includes a component wall 224 defining a component outer surface 226. The printhead 210 defines a printhead nozzle gap distance 228 with the outer surface 226 of the component wall 224. As will be explained in more detail below, the printhead nozzle gap distance 228 may be controlled to ensure an aerosol ink flow (along the deposition path 222) through the aerosol ink outlet 220 of the printhead 210 reaches the outer surface 226 of the component wall 224 in a desired manner.

In such a manner it will be appreciated that the printer 204 may deposit aerosol ink on the component 205 using the printhead 210 by delivering the aerosol ink along the deposition path 222 from the aerosol ink outlet 220 of the printhead 210 to the outer surface 226 of the component wall 224. Further, in such a manner it will be appreciated that the printer 204 may "print" features on the outer surface 226 of the component wall 224, such as the one or more strain sensors 202 at a strain sensor thickness 203.

Moreover, as briefly noted above, aerosol inks that may be utilized with the present disclosure are generally aerosol inks that include chromium-based metallic nanoparticles. A shape of the chromium-based metallic nanoparticles may vary based on the desired printing application. For example, in certain embodiments, the chromium-based metallic nanoparticles may have a substantially spherical shape. In other embodiments, the chromium-based metallic nanoparticles may be flake-like shapes or other irregular shapes. Further, still the chromium-based metallic nanoparticles may generally include chromium mixed with at least one alloying element. For example, suitable alloying elements 272 may include palladium, copper, nickel, platinum, gold, silver, iron, titanium, indium tin oxide, cobalt, rhodium, tungsten, or mixtures thereof. Moreover, in particular embodiments, the chromium-based metallic nanoparticles may be purified before being mixed to form the aerosol ink. Such a purification process may be configured to remove contaminants and other materials that may poison the resulting aerosol ink composition. For example, reactive materials may be removed from the chromium-based metallic nanoparticles.

The chromium-based metallic nanoparticles may be loaded to a maximum solvable amount. For example, the plurality of chromium-based metallic nanoparticles may be present in a loading amount of 5% to 30% by weight of the total aerosol ink (e.g., 5% to 10% by weight), or alternatively in any other suitable loading amount (e.g., less than 5% or greater than 30% by weight of the total aerosol ink). The solvent system may generally have a viscosity of 0.5 cP to 1000 cP (e.g., a viscosity of 1 cP to 3 cP), or alternatively any other suitable viscosity. This relatively high viscosity allows for stabilization of the chromium-based metallic nanoparticles against gravitational settling. In one embodiment, the solvent system includes at least two solvents that are miscible with each other. Alternatively, however, any other suitable number of solvents may be used.

It will be appreciated, however, that in other exemplary embodiments, any other suitable ink may be utilized for printing one or more strain sensors on a component. For example, in other exemplary embodiments an aerosol ink not including chromium-based metallic nanoparticles may be used, such as an aerosol ink including palladium containing alloy particles, or including any other suitable metallic particles or combination of metallic particles. Alternatively, still, an aerosol ink having larger metallic (or other) particles may be used (e.g., as compared to the nanoparticles discussed above).

Moreover, as is also depicted in FIG. 2, the exemplary system 200 for printing the strain sensor 202 on the component 205 depicted includes a one or more sensors and a computing system 230 operable with the printer 204 and the one or more sensors. More specifically, for the exemplary embodiment depicted, the one or more sensors includes an aerosol ink sensor 232 for sensing data indicative of one or more parameters of the aerosol ink (e.g., aerosol ink flow rate, aerosol ink temperature, aerosol ink droplet size, etc.); a printhead movement sensor 234 for sensing data indicative of movement of the printhead 210 (e.g., a printhead velocity along one or more of the lateral direction L, transverse direction, and/or extension direction E); a printhead position sensor 236 for sensing data indicative of a position of the printhead 210 relative to, e.g., the outer surface 226 of the component 205 (e.g., data indicative of a nozzle gap distance 228); and a component sensor 238 for sensing data indicative of one or more parameters of the component 205 (e.g., data indicative of a temperature of the component 205).

As noted, the computing system 230 is operable with the one or more sensors. The computing system 230 generally includes one or more computing devices 248A. The exemplary computing device(s) 248A depicted include one or more processor(s) 248B and one or more memory device(s) 248C. The one or more processor(s) 248B can include any suitable processing device, such as a microprocessor, microcontroller, integrated circuit, an application specific integrated circuit (ASIC), a digital signal processor (DSP), a field-programmable gate array (FPGA), logic device, one or more central processing units (CPUs), graphics processing units (GPUs) (e.g., dedicated to efficiently rendering images), processing units performing other specialized calculations, etc. The memory device(s) 248C can include one or more non-transitory computer-readable storage medium(s), such as RAM, ROM, EEPROM, EPROM, flash memory devices, magnetic disks, etc., and/or combinations thereof.

The memory device(s) 248C can include one or more computer-readable media and can store information accessible by the one or more processor(s) 248B, including instructions 248D that can be executed by the one or more processor(s) 248B. For instance, the memory device(s) 248C can store instructions 248D for running one or more software applications, displaying a user interface, receiving user input, processing user input, etc. In some implementations, the instructions 248D can be executed by the one or more processor(s) 248B to cause the one or more processor(s) 248B to perform operations, e.g., such as one or more portions of methods described herein. The instructions 248D can be software written in any suitable programming language or can be implemented in hardware. Additionally, and/or alternatively, the instructions 248D can be executed in logically and/or virtually separate threads on processor(s) 248B.

The one or more memory device(s) 248C can also store data 248E that can be retrieved, manipulated, created, or stored by the one or more processor(s) 248B. The data 248E can include, for instance, data to facilitate performance of methods described herein. The data 248E can be stored in one or more database(s) locally, or alternatively at a remote location and connected to computing system 230 by a high bandwidth LAN or WAN, or can also be connected to controller through network(s) (not shown). The one or more database(s) can be split up so that they are located in multiple locales. In some implementations, the data 248E can be received from another device.

The computing device(s) 248A depicted also includes a communication module or interface 248F used to communicate with one or more other component(s) of computing system 230 or overall system 200 over the network(s). The communication interface 248F can include any suitable components for interfacing with one or more network(s), including for example, transmitters, receivers, ports, controllers, antennas, or other suitable components. More specifically, for the exemplary aspect depicted, the communications interface 248F is operable with a wireless communication network 250.

Referring still to FIG. 2, the computing system 230 is operable with the one or more sensors through the communications interface 248F and the wireless communication network 250. In such a manner, the computing system 230 may receive data from the one or more sensors 232, 234, 236, 238, such as data indicative of the various parameters/operating conditions discussed above. Moreover, as is also depicted in FIG. 2, the computing system 230 is operable with various components 205 of the printer 204 through the communications interface 248F and the wireless communication network 250. For example, the computing system 230 is operable with the printhead assembly 208 and the atomizer 206. As such, the computing system 230 may be configured to control various aspects of the printhead 210, such as a printhead velocity, a printhead print path, an aerosol ink flowrate/droplet size, etc.

Referring still to FIG. 2, it will be appreciated that the exemplary system 200 is further configured for determining where to print the strain sensor 202 on the component 205, as well as a preferred feature dimension, orientation, and/or shape of the strain sensor 202 to be printed on the component 205.

Figure 3:
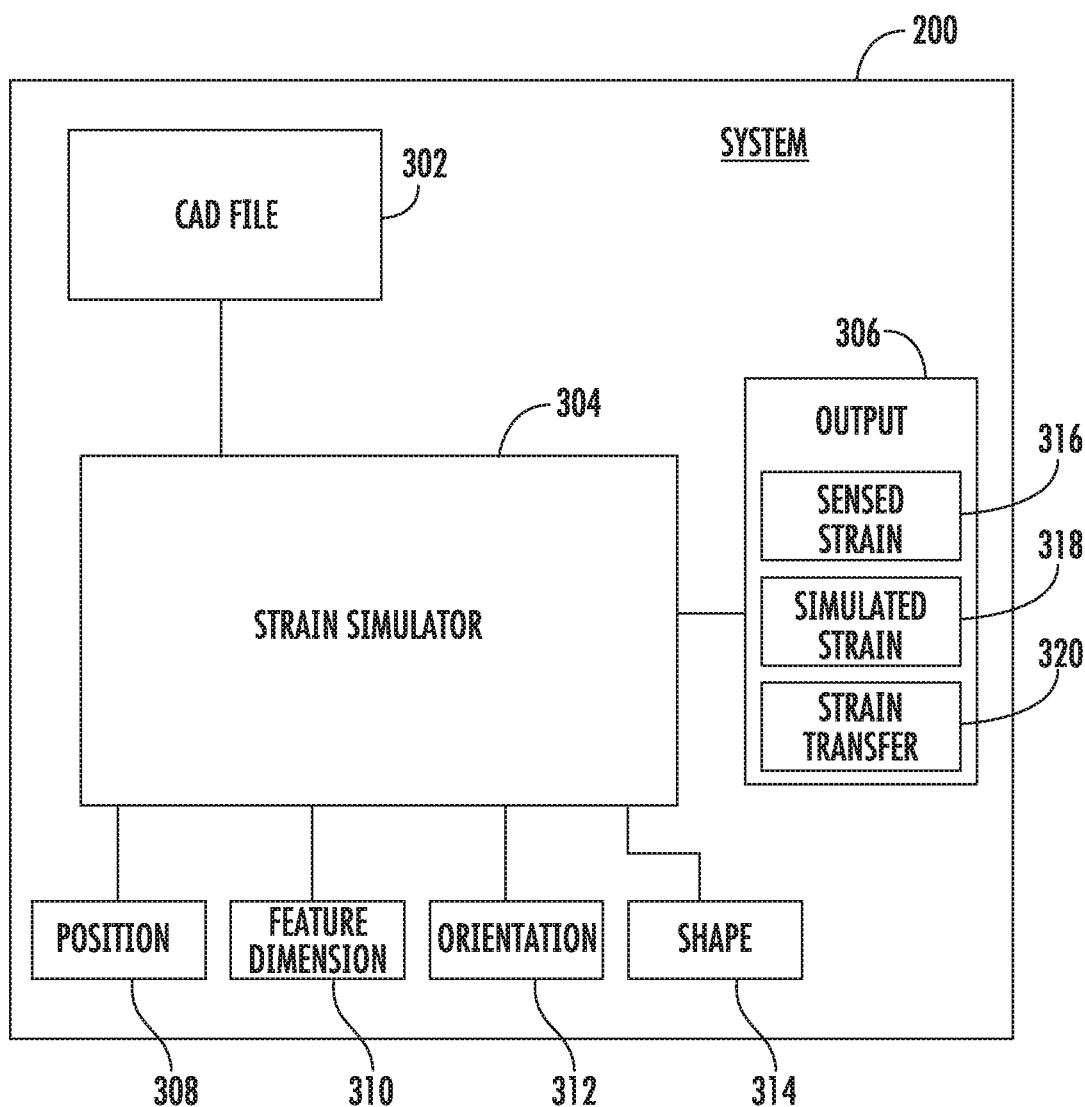
FIG. 3 shows a schematic module view of a system in accordance with an exemplary aspect of the present disclosure.

More specifically, referring briefly to FIG. 3, providing another schematic, module view of the system 200, it will be appreciated that the exemplary system 200 may be configured to model the component 205. The aspect of the system 200 described herein below with reference to FIG. 3 may be incorporated into a computer of the computing system 230 described above (e.g., as a module of such computer/computing system 230), or alternatively the system 200, or rather the computing system 230, may include two or more computers/computing systems in communication with one anther but otherwise separate for performing these functions.

Referring still to FIG. 3, the exemplary system 200 may be configured to model the component 205 based on, e.g., a 3D, computer-aided design (CAD) file 302 for the component 205 and a strain simulator program 304. As such, through the modeling of the component 205, the system 200 may be configured to simulate various strains on the component 205, as well as various strain transfers (i.e., strain transfer from the component 205 to the strain sensor 202) to assist with determining the preferred placement of the strain sensor 202, as well as the preferred feature dimension, orientation, and/or shape for the strain sensor 202.

More specifically, the strain simulator program 304 is configured to receive as an input, the CAD file 302. Moreover, the strain simulator program 304 is configured to modify certain strain sensor variables to determine an output 306 (e.g., the strain simulator program 304 may automatically modify these strain sensor variables, or the strain simulator program 304 may modify these strain sensor variables in response to user input(s) and/or user directions). More specifically, for the embodiment shown, the variables include a strain sensor position 308, a strain sensor feature dimensions 310, a strain sensor orientation 312, and a strain sensor shape 314. As used herein, the term "strain sensor feature dimension," with respect to a particular strain sensor, includes a thickness/height of a strain sensor grid of the strain sensor (see, e.g., thickness 203 in FIG. 2), a width of the strain sensor grid of the strain sensor, a length of the strain sensor grid of the strain sensor, and a number of grids of the strain sensor. The strain simulator program 304 may run various strain simulations for the component characterized by the received CAD file 302, varying the above-noted variables 308, 310, 312, 314 to achieve a desired output 306. For the embodiment shown, the output 306 includes a sensed strain 316 (indicating what a strain sensor characterized by the variables 308, 310, 312, 314 would detect), a simulated strain 318 (indicating what the actual strain on the component 205 at a location/area where the simulated strain sensor is positioned is expected to be), and a strain transfer 320 (from the component 205 to the strain sensor). The system 200 may run simulations using the strain simulator program 304 until a desired output 306 is achieved. Once the desired output 306 is achieved, the values for the variables 308, 310, 312, 314 may be considered the preferred values for such variables 308, 310, 312, 314. It will be appreciated that the desired output 306 may be a minimum strain transfer threshold, a minimum strain sensor accuracy, or a combination of the two.

Accordingly, it will be appreciated that the strain simulator program 304 may iteratively model strain on the component 205 with simulated strain sensors 202 of various sizes, orientations, shapes, and placements to determine the preferred feature dimension, orientation, shape, and placement to measure strain on the component 205 with a desired accuracy, as well as with a desired strain transfer. For example, it will be appreciated that with prior strain sensors, all strain on the component 205 may not be transferred to the strain sensors given the attachment of the strain sensors to the component 205 through an adhesive or other intermediate substance. The strain transfer may thus be a percentage, indicative of a loss or error in the transfer of strain from the component 205 to the strain sensor. Further, a geometry of the surface to which the strain sensor is attached may affect an amount of strain transfer from the component 205 to the strain sensor. Although with the present configuration the strain sensor 202 is printed directly to the surface of the component 205, the geometry of the surface of the component 205 may still affect an amount of strain transfer. Accordingly, the simulation program 304 may be used to select a size, orientation, shape, and/or placement for the strain sensor 202 to ensure a desired amount of strain transfer.

Figure 4:
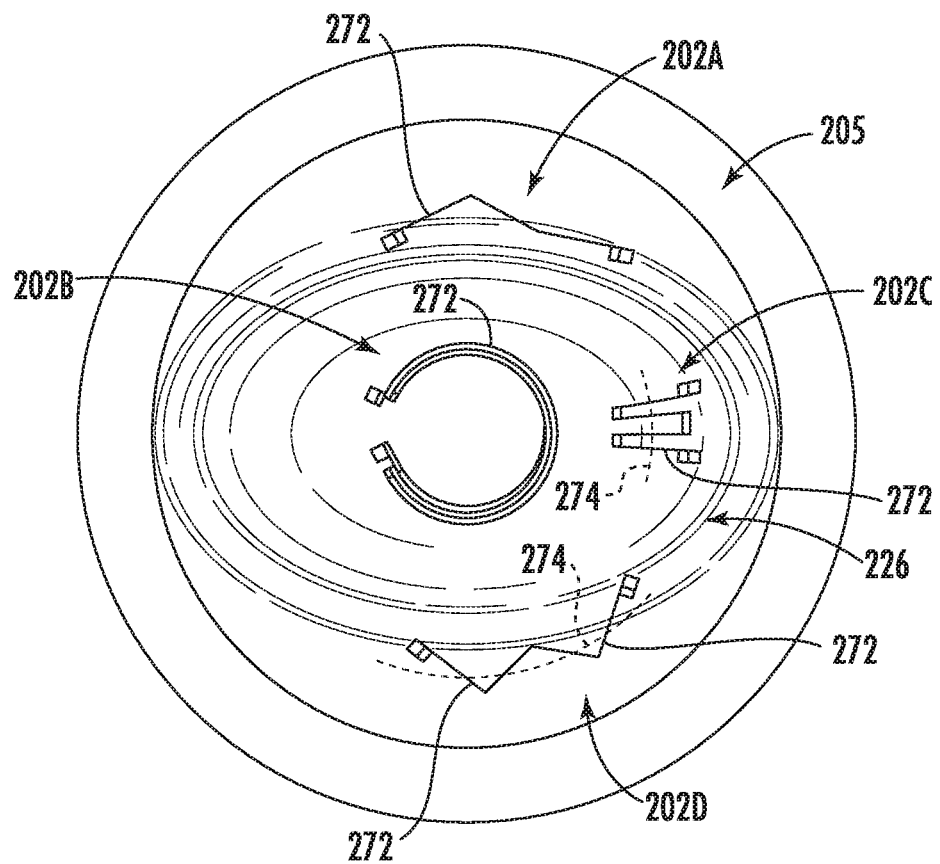
FIG. 4 shows an overhead, plan view of a component having a plurality of strain sensors printed thereon in accordance with an exemplary embodiment of the present disclosure.

Moreover, referring now to FIG. 4, a component 205 in accordance with an exemplary aspect of the present disclosure is depicted. The exemplary component 205 depicted in FIG. 4 is shown as a diaphragm (e.g., a semispherical dimple), with the strain on the component 205 depicted through the lighter lines for exemplary purposes. As is depicted, the component 205 includes a plurality of strain sensors 202 printed thereon. The strain sensors 202 printed on the component 205 of FIG. 4 may be printed by the system 200 described above with respect to FIG. 2, and in accordance with the variables determined according to the system 200 described above with respect to FIG. 3.

Once the preferred placement for the strain sensor 202, as well as the preferred feature dimension and orientation (and optionally shape) of the strain sensor 202 are determined (see FIG. 3), the system 200 may print the strain sensor 202 with the preferred feature dimension and in the preferred orientation (and optionally in the preferred shape) at the preferred placement on the component 205 (see FIG. 2). For example, as is depicted in FIG. 3, the system 200 has printed a first strain sensor 202A, a second strain sensor 202B, a third strain sensor 202C, and a fourth strain sensor 202D. Notably, each of the first strain sensor 202A, second strain sensor 202B, third strain sensor 202C, and fourth strain sensor 202D were printed on the component 205 at different placements, at different sizes and shapes, and in different orientations. As such, each of the strain sensors 202 is customized to the expected strain on the component 205 to more accurately sense data indicative of the strain, and to increase a strain transfer from the component 205 to the strain sensor 202.

Generally, it will be appreciated, that each of the exemplary strain sensors 202A, 202B, 202C, 202D depicted in FIG. 4 is oriented parallel to a potential primary strain direction of the component 205 when the component is subjected to it its most frequent or most detrimental loads. Further, it will be appreciated that each of the strain sensors 202A, 202B, 202C, 202D includes a plurality of individual elements 272, or legs, arranged in series. The plurality of elements 272 together form a grid of the respective strain sensor. A length of each of the individual elements 272 increases or decreases based on a strain gradient across the area in which the strain sensor 202 is printed. Further, as is depicted, the exemplary strain sensors 202A, 202B, 202C, 202D shown define a mean line 274 extending approximate halfway through each of the individual elements 272. For the embodiment shown, the mean line 274 of at least certain of the exemplary strain sensors 202 is nonlinear. For example, referring particularly to the third strain sensor 202C and the fourth strain sensor 202D, the mean line 274 follows a curvature of the component 205. Further, referring to the second strain sensor 202B, the exemplary elements 272 do not extend in a linear direction. Instead, for the embodiment of FIG. 4, the elements 272 of the second strain sensor 202B define a curved shape that follows a curvature of the component 205, and more specifically, defines a semicircular shape.

As will be appreciated from the component 205 and strain sensors 202A-202D depicted in FIG. 4, the system 200 may generally determine a surface feature of the component 205 indicating a high strain (e.g., a top of the component 205, and area of increase curvature, an area receiving higher forces, etc.), determine a strain gradient within an area over the surface feature, and correlate the preferred feature dimension of the strain sensor with the determined strain gradient to, e.g., reduce or minimize a strain gradient in the area in which the strain sensor is printed. Similarly, the system 200 may further determine a strain orientation of the component 205, and correlate the preferred orientation of the strain sensor 202 to the determined strain orientation to increase an accuracy of the strain sensor 202. Such is particularly indicated with strain sensors 202B, 202C, and 202D in FIG. 4. As will be appreciated from the description herein, the aspects of the system 200 providing these functionalities may effectively be a stand-alone computing system from the aspects of the system 200 printing strain sensor(s) on component(s).

Figure 5:
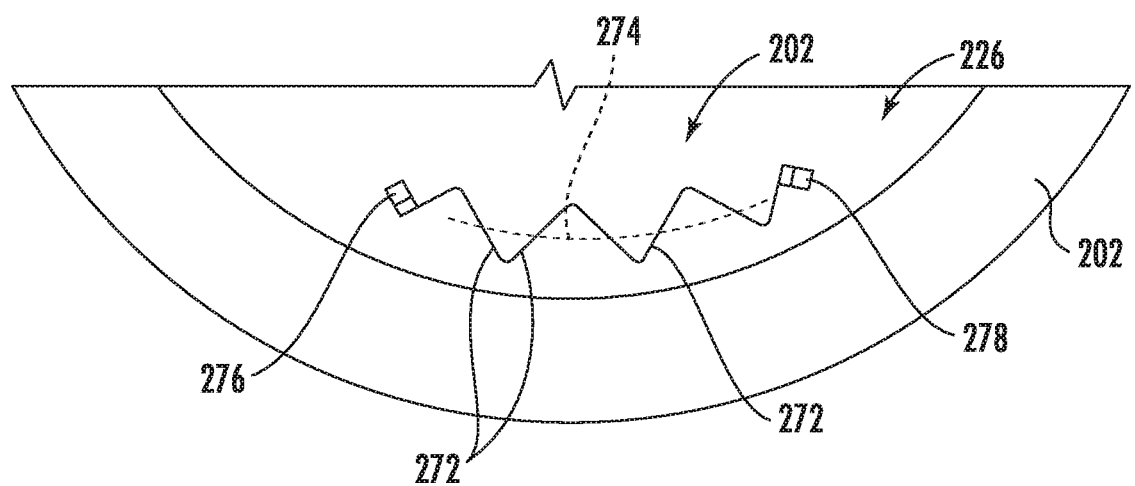
FIG. 5 shows a close-up view of a component having a plurality of strain sensors printed thereon in accordance with another exemplary embodiment of the present disclosure.

Notably, referring now to FIG. 5, providing a close-up view of a strain sensor 202 on a component 205, it will further be appreciated that the strain sensor 202 includes a first terminal 276 and a second terminal 278, with the plurality of elements 272 extending therebetween. A first lead wire may be electrically coupled to the first terminal 276 and a second lead wire may be electrically coupled to the second terminal 278. The first and second lead wires may be used to sense the strain on the component 205 by transmitting information indicative of a varying resistance through the elements 272 between the first terminal 276 and the second terminal 278.

In at least certain exemplary embodiments, the first terminal 276 and second terminal 278 may be printed with the elements 272 of the strain sensor 202, and the first lead wire and second lead wire may be electrically coupled thereto by subsequent brazing or other attachment method. Alternatively, in other embodiments, the first lead wire may be coupled to the first terminal 276 by printing the first terminal 276, or a portion thereof, over the first lead wire. More specifically, the first lead wire may be placed in position over an initially printed first lead pad, and the material may be printed over the first lead wire to form an electrical and mechanical joint. The first lead wire may subsequently be sintered to complete the connection. The second lead wire may be coupled to the second terminal 278 in a similar manner.

Figure 6:
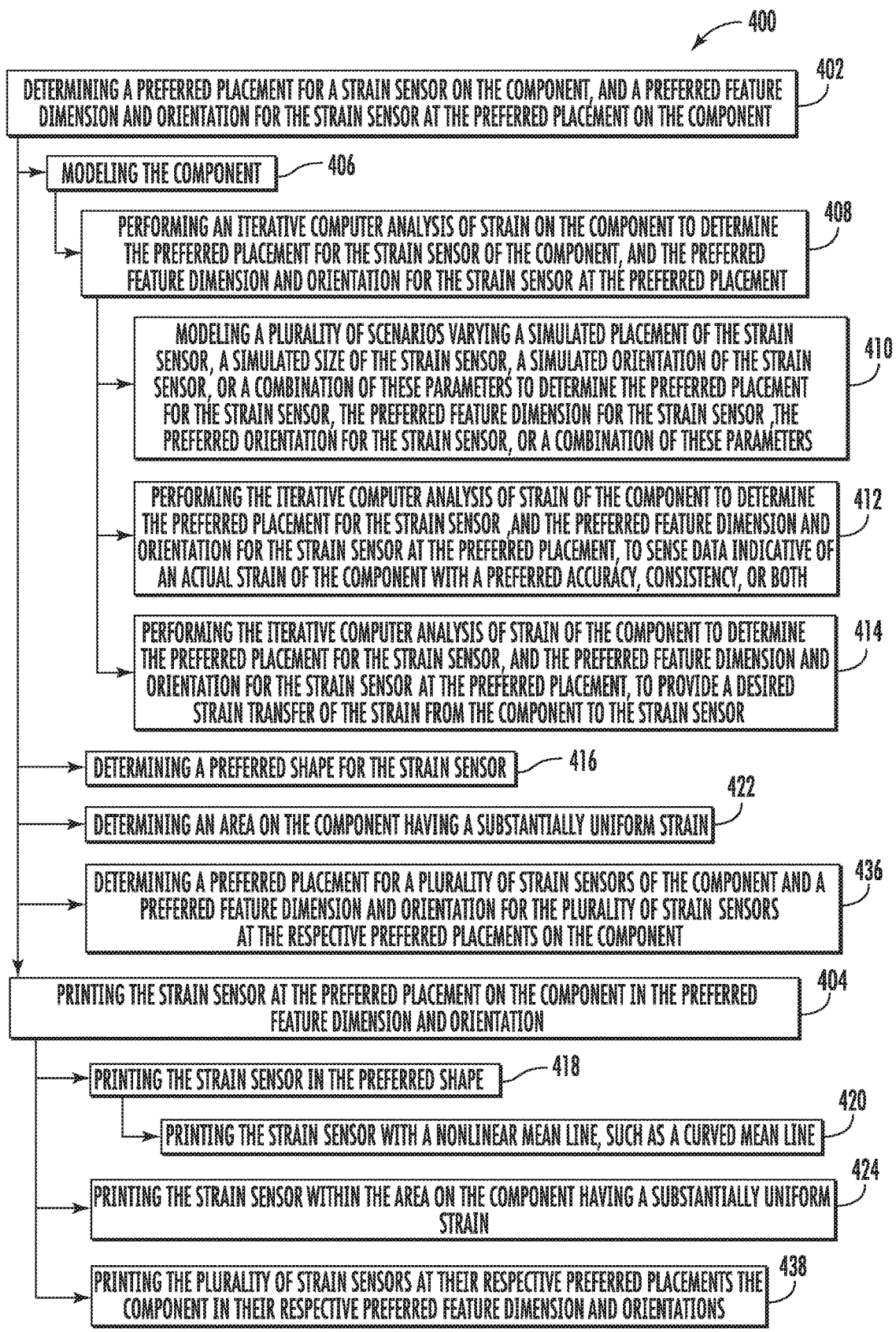
FIG. 6 shows a flow diagram of a method for measuring strain of a component in accordance with an exemplary aspect of the present disclosure.

Referring now to FIG. 6, a method 400 for measuring strain of a component is provided. The method 400 may utilize one or more of the exemplary systems 200 described above.

The method 400 includes at (402) determining a preferred placement for a strain sensor on the component, and a preferred feature dimension and orientation for the strain sensor at the preferred placement on the component. Additionally, the method 400 includes at (404) printing the strain sensor at the preferred placement on the component with the preferred feature dimension and orientation.

More specifically, for the exemplary aspect depicted, determining the preferred placement for the strain sensor of the component, and the preferred feature dimension and orientation for the strain sensor at (402) includes at (406) modeling the component. More specifically, modeling the component at (406) includes at (408) performing an iterative computer analysis of strain on the component to determine the preferred placement for the strain sensor of the component, and the preferred feature dimension and orientation for the strain sensor at the preferred placement. For example, for the exemplary aspect depicted, performing the iterative computer analysis at (408) includes at (410) modeling a plurality of scenarios varying a simulated placement of the strain sensor, a simulated size of the strain sensor, a simulated orientation of the strain sensor, or a combination of these parameters to determine the preferred placement for the strain sensor, the preferred feature dimension for the strain sensor, the preferred orientation for the strain sensor, or a combination of these parameters. For example, in certain exemplary aspects, the method 400 at (410) may model a plurality of scenarios varying each of the simulated placement, size, and orientation of the strain sensor to determine the preferred placement, size, and orientation for the strain sensor.

In certain exemplary aspects, performing the iterative computer analysis of the strain on the component at (408) may include at (412) performing the iterative computer analysis of strain of the component to determine the preferred placement for the strain sensor, and the preferred feature dimension and orientation for the strain sensor at the preferred placement, to sense data indicative of an actual strain of the component with a preferred accuracy, consistency, or both. Additionally, for the exemplary aspect depicted, performing the iterative computer analysis of the strain on the component at (408) includes at (414) performing the iterative computer analysis of strain of the component to determine the preferred placement for the strain sensor, and the preferred feature dimension and orientation for the strain sensor at the preferred placement, to provide a desired strain transfer of the strain from the component to the strain sensor.

Moreover, it will be appreciated that for the exemplary aspect of the method 400 depicted, determining the preferred placement for the strain sensor of the component, and the preferred feature dimension and orientation for the strain sensor at the preferred placement at (402) further includes at (416) determining a preferred shape for the strain sensor. Similarly, for the exemplary aspect depicted, printing the strain sensor at the preferred placement on the component and with the preferred feature dimension and orientation at (404) includes at (418) printing the strain sensor in the preferred shape. For example, in certain exemplary aspects, printing the strain sensor in the preferred shape at (418) may include at (420) printing the strain sensor with a nonlinear mean line, such as a curved mean line.

It will be appreciated from the description above, one factor contributing to an accuracy of a strain reading of a strain sensor is a uniformity of strain in the area where the strain sensor is positioned. Accordingly, for the exemplary aspect depicted, determining the preferred placement for the strain sensor the component, and the preferred feature dimension and orientation for the strain sensor at the preferred placement on the component at (402) includes at (422) determining an area on the component having a substantially uniform strain. Additionally, printing the strain sensor at the preferred placement of the component with the preferred feature dimension and orientation (404) includes at (424) printing the strain sensor within the area on the component having a substantially uniform strain.

Figure 7:
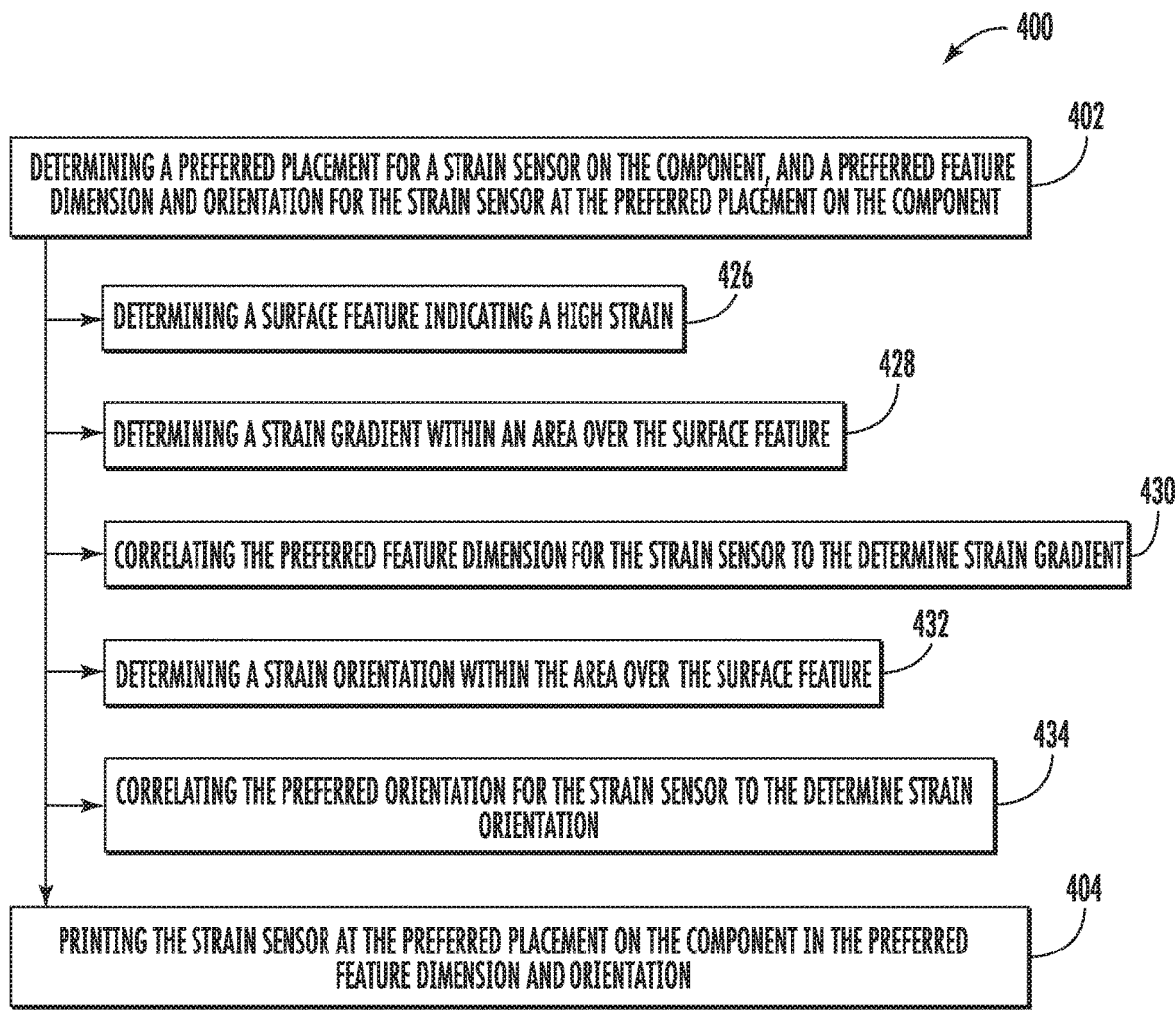
FIG. 7 shows a flow diagram of an exemplary aspect of the method of FIG. 6 in accordance with an exemplary aspect of the present disclosure.

More specifically, referring now briefly to FIG. 7, providing a more detailed flow diagram of an aspect of the method 400 of FIG. 6, for the exemplary aspect depicted, determining the preferred placement for the strain sensor of the component, and the preferred feature dimension and orientation for the strain sensor at the preferred placement at (402) further includes at (426) determining a surface feature indicating a high strain, at (428) determining a strain gradient within an area over the surface feature, and at (430) correlating the preferred feature dimension for the strain sensor to the determine strain gradient. For example, the larger the strain gradient, the smaller the size of the strain sensor (or rather, the shorter the lengths of the elements of the strain sensor) should be to ensure a desired accuracy of the strain sensor. By contrast, the smaller the strain gradient, the larger the size of the strain sensor (or rather, the longer the lengths of the elements of the strain sensor) may be while still having a desired accuracy for the strain sensor.

Similarly, for the exemplary aspect depicted, determining the preferred placement for the strain sensor on the component, and the preferred feature dimension and orientation for the strain sensor at the preferred placement at (402) further includes at (432) determining a strain orientation within the area over the surface feature, and at (434) correlating the preferred orientation for the strain sensor to the determine strain orientation. More specifically, it may generally be preferable to orient the strain sensor in a direction perpendicular to the strain orientation.

The further, still, referring now back to FIG. 6, it will be appreciated that method 400 may be utilized to print a plurality of strain sensors. Accordingly, with such an exemplary aspect, determining the preferred placement for the strain sensor of the component and the preferred feature dimension and orientation for the strain sensor at the preferred placement at (402) includes at (436) determining a preferred placement for a plurality of strain sensors of the component and a preferred feature dimension and orientation for the plurality of strain sensors at the respective preferred placements on the component. Similarly, with such an exemplary aspect, printing the strain sensor at the preferred placement on the component, and with the preferred feature dimension and orientation at (404) includes at (438) printing the plurality of strain sensors at their respective preferred placements the component in their respective preferred feature dimensions and orientations. In at least certain exemplary aspects, the preferred feature dimensions, as well as preferred orientations and (if determined) preferred shapes, of the respective plurality of strain sensors is unique.

This written description uses exemplary embodiments to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. A method for measuring strain of a component, the method comprising:
    determining, by modeling the component, a preferred placement for a strain sensor on the component, and a preferred feature dimension and orientation for the strain sensor at the preferred placement on the component; and
    printing the strain sensor at the preferred placement on the component with the preferred feature dimension and orientation,
    wherein modeling the component includes modeling a plurality of scenarios varying a simulated placement of the strain sensor, a simulated size of the strain sensor, and a simulated orientation of the strain sensor to determine the preferred placement for the strain sensor, the preferred feature dimension for the strain sensor, and the preferred orientation for the strain sensor.

2. The method of claim 1, wherein determining the preferred placement for the strain sensor on the component, and the preferred feature dimension and orientation for the strain sensor at the preferred placement on the component comprises determining an area on the component having a substantially uniform strain.

3. The method of claim 2, wherein printing the strain sensor at the preferred placement on the component with the preferred feature dimension and orientation comprises printing the strain sensor within the area on the component having the substantially uniform strain.

4. The method of claim 1, wherein determining the preferred placement for the strain sensor on the component, and the preferred feature dimension and orientation for the strain sensor at the preferred placement on the component comprises:
    determining a surface feature indicating a high strain;
    determining a strain gradient within an area over the surface feature; and
    correlating the preferred feature dimension for the strain sensor to the determined strain gradient.

5. The method of claim 4, wherein determining the preferred placement for the strain sensor on the component, and the preferred feature dimension and orientation for the strain sensor at the preferred placement on the component further comprises:
    determining a strain orientation within the area over the surface feature; and
    correlating the preferred orientation for the strain sensor to the determined strain orientation.

6. The method of claim 1, wherein determining the preferred placement for the strain sensor on the component, and the preferred feature dimension and orientation for the strain sensor at the preferred placement on the component further comprises determining a preferred shape for the strain sensor, and wherein printing the strain sensor at the preferred placement on the component with the preferred feature dimension and orientation further comprises printing the strain sensor in the preferred shape.

7. The method of claim 6, wherein printing the strain sensor in the preferred shape comprises printing the strain sensor with a nonlinear mean line.

8. The method of claim 1, wherein determining the preferred placement for the strain sensor on the component, and the preferred feature dimension and orientation for the strain sensor at the preferred placement on the component comprises determining a preferred placement for a plurality of strain sensors on the component, and a preferred feature dimension and orientation for the plurality of strain sensors at the respective preferred placements on the component, and wherein printing the strain sensor at the preferred placement on the component with the preferred feature dimension and orientation comprises printing the plurality of strain sensors at their respective preferred placements on the component in their respective preferred feature dimensions and in their respective preferred orientations.

9. The method of claim 8, wherein each of the preferred feature dimensions of the respective plurality of strain sensors is unique.

10. The method of claim 1, wherein the component is a component of a gas turbine engine having a non-planar surface.

11. The method of claim 1, wherein printing the strain sensor at the preferred feature dimension and in the preferred orientation at the preferred placement on the component comprises printing the strain sensor on the component using an aerosol-based direct-write process utilizing an aerosol ink comprising chromium containing alloy particles.

12. A system for measuring strain of a component, the system comprising:
- a printer comprising an atomizer and a print heat fluidly connected to the atomizer for receiving an aerosol ink from the atomizer; and
- a control system operable with the printer, the control system comprising one or more processors and memory, the memory storing instructions that, when executed by the one or more processors, cause the system to:
  - determine, by modeling the component, a preferred placement for a strain sensor on the component, and a preferred feature dimension and orientation for the strain sensor at the preferred placement on the component; and
  - print the strain sensor at the preferred placement on the component with the preferred feature dimension and in the preferred orientation,
  - wherein modeling the component includes modeling a plurality of scenarios varying a simulated placement of the strain sensor, a simulated size of the strain sensor, and a simulated orientation of the strain sensor to determine the preferred placement for the strain sensor, the preferred feature dimension for the strain sensor, and the preferred orientation for the strain sensor.

13. The system of claim 12, wherein the aerosol ink comprises chromium containing alloy particles.

\* \* \* \* \*